(12) United States Patent
Qi

(10) Patent No.: US 11,088,253 B2
(45) Date of Patent: Aug. 10, 2021

(54) GATE STRUCTURE OF SEMICONDUCTOR DEVICE AND MANUFACTURING METHOD THEREFOR

(71) Applicant: CSMC TECHNOLOGIES FAB2 CO., LTD., Jiangsu (CN)

(72) Inventor: Shukun Qi, Jiangsu (CN)

(73) Assignee: CSMC TECHNOLOGIES FAB2 CO., LTD., Jiangsu (CN)

( * ) Notice: Subject to any disclaimer, the term of this patent is extended or adjusted under 35 U.S.C. 154(b) by 102 days.

(21) Appl. No.: 16/483,396

(22) PCT Filed: Jul. 3, 2018

(86) PCT No.: PCT/CN2018/094359
§ 371 (c)(1),
(2) Date: Aug. 2, 2019

(87) PCT Pub. No.: WO2019/007344
PCT Pub. Date: Jan. 10, 2019

(65) Prior Publication Data
US 2020/0013864 A1    Jan. 9, 2020

(30) Foreign Application Priority Data
Jul. 3, 2017   (CN) .......................... 201710534704.0

(51) Int. Cl.
*H01L 29/40* (2006.01)
*H01L 29/423* (2006.01)
(Continued)

(52) U.S. Cl.
CPC ........ *H01L 29/4236* (2013.01); *H01L 29/401* (2013.01); *H01L 29/407* (2013.01);
(Continued)

(58) Field of Classification Search
CPC ............... H01L 29/407; H01L 29/7813; H01L 29/7825
See application file for complete search history.

(56) References Cited

U.S. PATENT DOCUMENTS

| 8,319,278 B1 * | 11/2012 | Zeng ................... H01L 29/7802 257/330 |
| 2011/0127602 A1 * | 6/2011 | Mallikarjunaswamy ................... H01L 29/0649 257/331 |

(Continued)

FOREIGN PATENT DOCUMENTS

| CN | 102738240 A | 10/2012 |
| CN | 104051509 A | 9/2014 |

(Continued)

OTHER PUBLICATIONS

International Search Report, dated Sep. 21, 2018 for corresponding International Application No. PCT/CN2018/094359 with English translation.

(Continued)

*Primary Examiner* — Bryan R Junge
(74) *Attorney, Agent, or Firm* — Intellectual Property Law Group LLP

(57) ABSTRACT

A gate structure of a semiconductor device, includes: a trench gate and a planar gate including a plurality of polysilicon structures (406) separated from each other; the gate structure of the semiconductor device further includes a well region (503) being adjacent to the trench gate and being disposed under the planar gate; a first conduction type doped region (504) being disposed in the well region (503) and including a plurality of regions separated from each other, wherein each region is disposed under adjacent polysilicon structures (406), and respective regions are electrically connected to the planar gate; and a source (504a) being disposed in the well region (503); wherein the trench gate (Continued)

includes: a silicon oxide filler (202) including a side wall silicon oxide and a bottom silicon oxide; a control gate (402) being located over the trench gate, wherein a side wall of the control gate is enclosed by the side wall silicon oxide, and the control gate (402) is electrically-connected to the planar gate; a shield gate (404) having a single segment structure or a longitudinally arranged multiple segments structure; and an insulation silicon oxide (204) being filled between adjacent control gate and shield gate in vertical direction.

20 Claims, 13 Drawing Sheets

(51) Int. Cl.
 *H01L 29/66* (2006.01)
 *H01L 29/78* (2006.01)
(52) U.S. Cl.
 CPC .. *H01L 29/66621* (2013.01); *H01L 29/66704* (2013.01); *H01L 29/7825* (2013.01)

(56) References Cited

U.S. PATENT DOCUMENTS

| | | | |
|---|---|---|---|
| 2014/0264433 A1* | 9/2014 | Hu | H01L 29/42368 257/139 |
| 2017/0069727 A1* | 3/2017 | Blanchard | H01L 29/0623 |

FOREIGN PATENT DOCUMENTS

| | | |
|---|---|---|
| CN | 105226020 A | 1/2016 |
| EP | 1487023 A3 | 12/2009 |

OTHER PUBLICATIONS

Written Opinion of the ISA, dated Feb. 2, 2018 for corresponding International Application No. PCT/CN2018/094359.

* cited by examiner

GATE STRUCTURE OF SEMICONDUCTOR DEVICE AND MANUFACTURING METHOD THEREFOR

TECHNICAL FIELD

The present disclosure relates to semiconductor manufacturing technology, and more particularly to a gate structure of a semiconductor device, and to a method for manufacturing the gate structure of the semiconductor device.

BACKGROUND

How to optimize a trench isolation process and improve a trench morphology under a situation that a device length is constant (an area as well as an on-resistance is constant), thereby optimizing a distribution of an electric field during breakdown and increasing a breakdown voltage, and further expanding an optimizing space for continuously reducing the on-resistance ($R_{on,\ sp}$) is a continuous improving and optimizing object of a lateral diffusion metal oxide semiconductor field effect transistor (LDMOSFET) device.

SUMMARY

It is provided a gate structure of a semiconductor device and a method for manufacturing the same according to various embodiments of the present disclosure.

A gate structure of a semiconductor device includes: a trench gate and a planar gate including a plurality of polysilicon structures separated from each other; the gate structure of the semiconductor device further includes a well region of a second conduction type being adjacent to the trench gate and being deposed under the planar gate; a first conduction type doped region being deposed in the well region and including a plurality of regions separated from each other, wherein each region is deposed under adjacent polysilicon structures, and respective regions are electrically connected to the planar gate; and the first conduction type and the second conduction type are opposite to each other in electrical property; and a source of the first conduction type being deposed in the well region; wherein the trench gate includes: a silicon oxide filler including a side wall silicon oxide located at a trench side wall of the trench gate, and a bottom silicon oxide located at a bottom of the trench gate, wherein a thickness of the side wall silicon oxide gradually thickens along a downward direction; a control gate of a polysilicon material being located over the trench gate, wherein a side wall of the control gate is enclosed by the side wall silicon oxide, and the control gate is electrically connected to the planar gate; a shield gate of a polysilicon material having a single segment structure or a longitudinally arranged multiple segments structure; and an insulation silicon oxide being filled between adjacent control gate and shield gate in vertical direction, or being filled between adjacent control gate and shield gate in vertical direction and between adjacent shield gates of the multiple segments structure.

A method for manufacturing a gate structure of a semiconductor device, includes: a step A: defining a trench at a wafer surface; a step B: filling the trench with silicon oxide by deposition; a step C: removing a portion of the silicon oxide in the trench by etching; a step D: forming a silicon oxide corner structure at a top corner of the trench by thermal oxidizing, wherein the silicon oxide corner structure is a structure that the silicon oxide in the trench gradually thickens downward from the corner; a step E: depositing a nitrogenous compound at the wafer surface covering a surface of the silicon oxide in the trench and a surface of the silicon oxide corner structure; a step F: dry-etching the nitrogenous compound to remove the nitrogenous compound on the surface of the silicon oxide in the trench and form a side wall residue of the nitrogenous compound extending into the trench on the surface of the silicon oxide corner structure; a step G: removing a portion of the silicon oxide in the trench by etching with the side wall residue of the nitrogenous compound as a mask; a step H: removing the nitrogenous compound in the trench; a step I: filling the trench with polysilicon as a shield gate; a step J: forming an insulation silicon oxide on the shield gate; a step K: filling with polysilicon on the insulation silicon oxide as a control gate; a step L: forming a well region adjacent to the trench by implanting doped ions with a second conduction type; a step M: forming a plurality of polysilicon structures separated from each other over the well region as a planar gate; a step N: electrically connecting the control gate to the planar gate.

The details of one or more embodiments of the present disclosure are set forth in the accompanying drawings and description below. Other features, objects, and advantages of the present disclosure will be apparent from the description, drawings, and claims.

BRIEF DESCRIPTION OF THE DRAWINGS

To describe and illustrate the embodiments and/or examples disclosed herein by the present disclosure more clearly, one or more accompanying drawings could be referred. Additional details or examples used to describe the accompanying drawings should not be considered as limiting the scope of any one of the disclosed application, the embodiments and/or examples currently described, and the best modes of the present disclosure currently understood.

DETAILED DESCRIPTION OF THE EMBODIMENTS

For the convenience of understanding the present disclosure, a more comprehensive description of the present disclosure will be made by referring the accompanying drawings below. A preferred embodiment of the present disclosure is given in the accompanying drawings. However, the present disclosure may be implemented in many different forms and is not limited to the embodiments described herein. Rather, the purpose of providing these embodiments is to make the disclosure of the present disclosure more thorough and comprehensive.

Unless otherwise defined, all terms (including technical and scientific terms) used herein have the same meaning as commonly understood by those persons skilled in the art. The terms used in the description of the present disclosure are only for the purpose of describing specific embodiments, and are not intended to limit the present disclosure. The term "and/or" used herein should include any one of and all of the combinations of one or more relevant listed items.

The semiconductor field terms used herein are common technical terms used by those persons skilled in the art, for example, for a P-type impurity and an N-type impurity, in order to distinguish a doping concentration, a P-type with heavy doping concentration is simply represented as a "P+"-type, a P-type with normal doping concentration is represented as a "P"-type, and a P-type with mild doping concentration is represented as a "P−"-type, besides an N-type with heavy doping concentration is simply represented as an "N+"-type, an N-type with normal doping concentration is represented as an "N"-type, and an N-type with mild doping concentration is represented as an "N−"-type.

Figure 1:
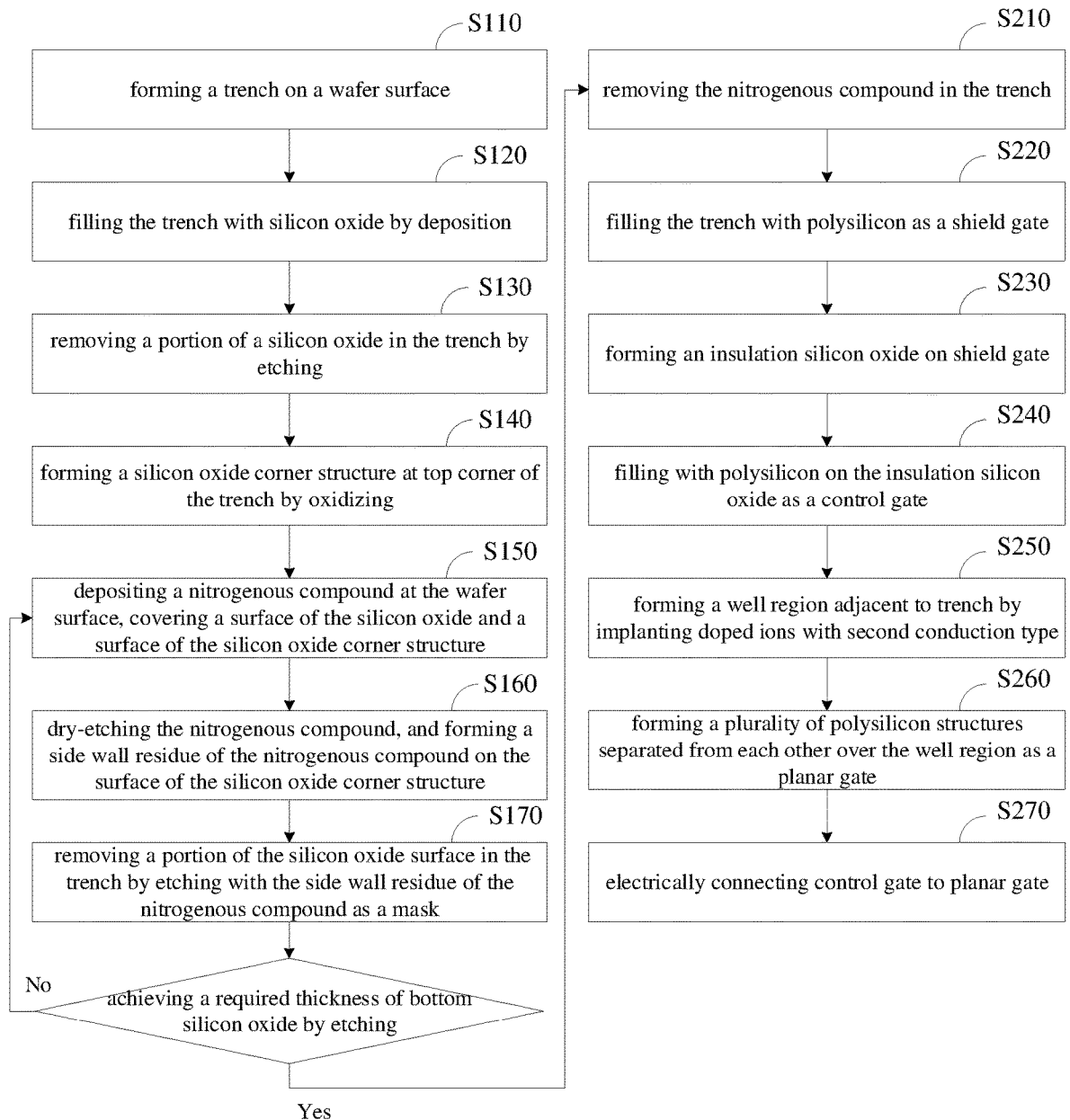
FIG. 1 is a flowchart of a method for manufacturing a gate structure of a semiconductor device in an embodiment.

FIG. 1 is a flowchart of a method for manufacturing a gate structure of a semiconductor device in an embodiment, and the method includes following steps.

In S110, a trench is defined at a wafer surface.

A trench adapted for a trench gate can be etched at a surface of a wafer which is a silicon chip in the present embodiment, by using a conventional process known in the art, a specific depth of the trench can be selected based on a design parameter of the device according to the prior art. In the present embodiment, silicon nitride can be used as a hard mask for etching the trench, in another word, firstly a silicon nitride layer on the wafer surface is patterned before etching the trench, and then the trench is etched at an exposed opening of the silicon nitride layer, so that the silicon nitride layer is formed around a top of the trench after finishing the etching. In the present embodiment, a reactive ion etching (RIE) process is used to etch the trench, however, in another embodiment, other process for etching the trench known in the art can be used.

In an embodiment, an epitaxial layer 102 with low doping concentration is epitaxially grown on a substrate with high doping concentration by an epitaxial process, and the trench achieved by the etching process is located in the epitaxial layer 102.

In S120, the trench is filled with silicon oxide by deposition.

A rate of forming the silicon oxide ($SiO_x$) layer by a deposition process is much faster than that of growing the silicon oxide layer by a conventional thermal oxidation process. In the present embodiment, in the step S120, a high-density plasma chemical vapor deposition (HDPCVD) process is used to deposit the silicon oxide, and a suitable morphology thereof can be obtained. In another embodiment, other deposition process for depositing the silicon oxide layer known in the art can also be used according to an actual requirement.

A redundant silicon oxide layer can be removed by using chemical mechanical polishing (CMP) process after finishing the deposition, that is, the silicon oxide layer exposed outside the trench is removed. For an embodiment that the silicon nitride is used as the hard mask for etching the trench in step S110, the silicon oxide layer is polished to expose the silicon nitride layer by the CMP.

In S130, a portion of the silicon oxide in the trench is removed by etching.

A dry-etching due to its anisotropy can be used to obtain a suitable morphology of the silicon oxide. In an embodiment, a high density plasma etching process can be used for the etching in step S130.

In S140, a silicon oxide corner structure is formed at a top corner of the trench by oxidizing.

Figure 2:
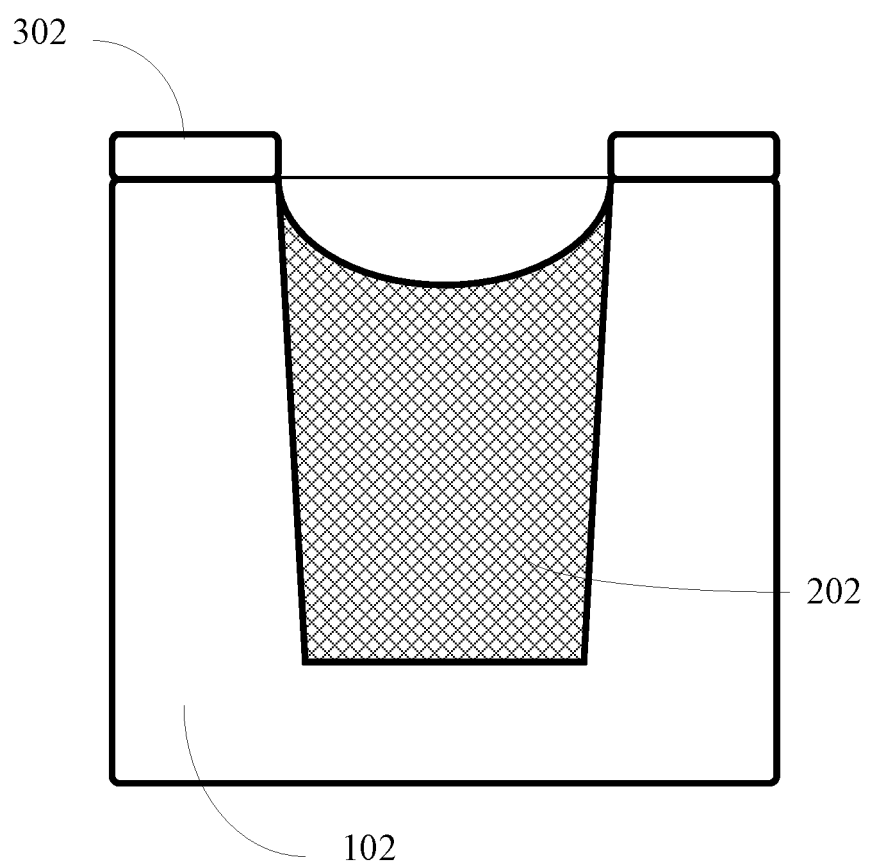
FIGS. 2 to 12 are cross-sectional views of devices manufactured during a manufacturing process by using the method for manufacturing the gate structure of the semiconductor device in an embodiment.

In order to implement that a side wall residue of nitrogenous compound obtained by subsequent steps can have a morphology required by the present embodiment, a particular morphology is formed by oxidizing after etching, that is, a concave surface similar to a hemisphere is defined by the silicon oxide in the trench. The silicon oxide inside the trench gradually thickens downward from the corner, so as to form a smooth corner shown in FIG. 2. In FIG. 2, the trench is formed at the surface of the silicon chip, the trench is filled with the silicon oxide 202, and the silicon nitride layer 302 is formed around the top of the trench. In the present embodiment, the silicon oxide corner structure is obtained via a low temperature oxidation at 800° C. to 950° C. (Celsius degree). The low temperature oxidation is used because the inventor have found that if a higher temperature (such as a sacrificial oxidation at 1000° C.) is used, the doped ions in the substrate with high concentration of the wafer can easily be diffused back into the epitaxial layer 102 with low concentration, which has a negative impact on the device performance.

In S150, the silicon nitride is deposited on the wafer surface covering the surface of silicon oxide and a surface of silicon oxide corner structure in the trench.

In the present embodiment, a thin layer of nitrogenous compound is formed by chemical vapor deposition, which is subsequently served as the hard mask for etching. The nitrogenous compound may be silicon nitride, silicon oxynitride, boron nitride, titanium nitride, and the like. The silicon nitride commonly used in the art can be used when considering the universality.

In S160, the nitrogenous compound is dry-etched to form the side wall residue of the nitrogenous compound extending into the trench on the surface of the silicon oxide corner structure.

Figure 3:
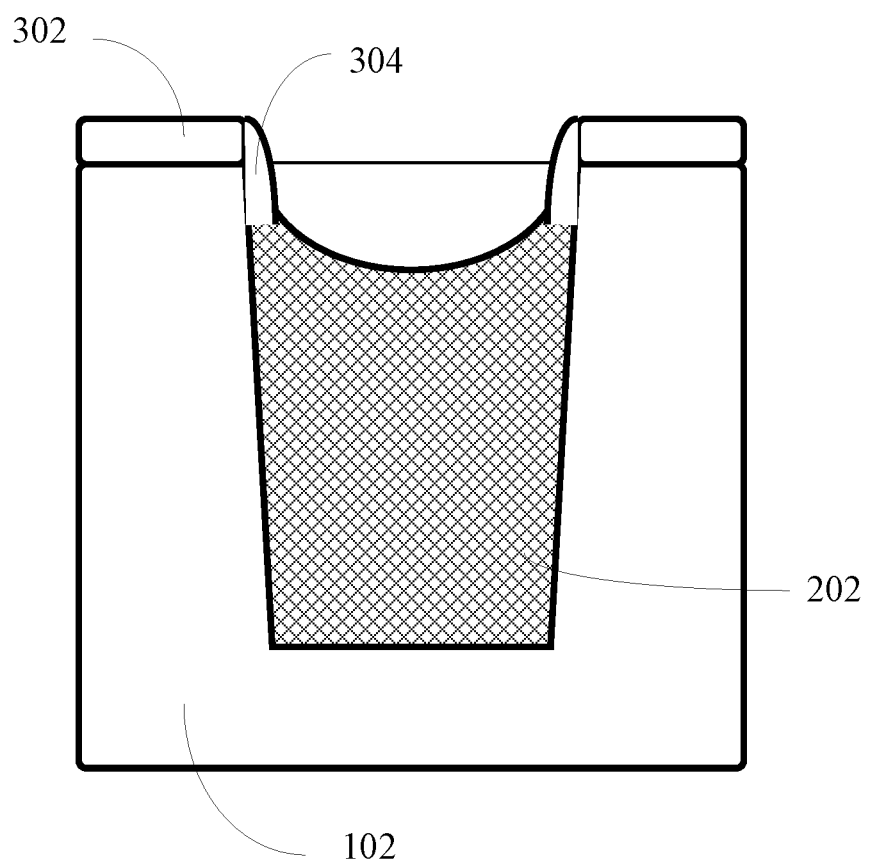

Referring to FIG. 3, the nitrogenous compound on the surface of the silicon oxide 202 in the trench is removed by using the anisotropy of the dry-etching, meanwhile, the side wall residue 304 of the nitrogenous compound extending into the trench is formed on the surface of the silicon oxide corner structure. The side wall residue 304 of the nitrogenous compound and a portion of the silicon oxide 202 in the trench are cooperatively served as a side wall structure of the trench.

In S170, a portion of the silicon oxide in the trench is removed by etching with the side wall residue of the nitrogenous compound served as a mask.

Figure 4:
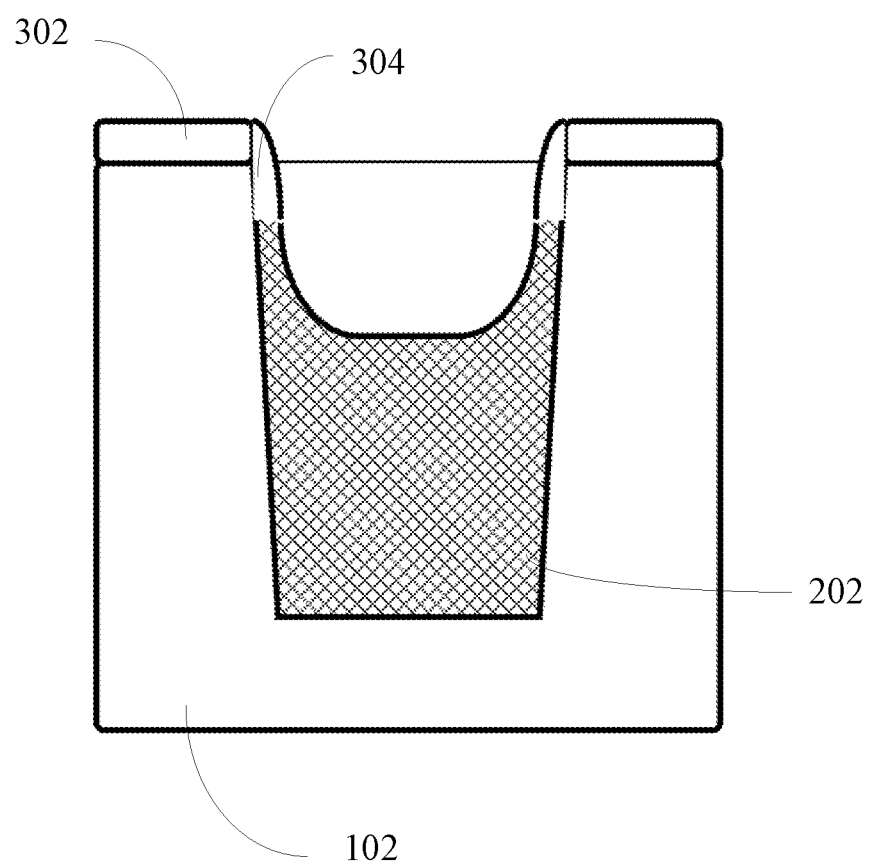

Referring to FIG. 4, the silicon oxide 202 is etched to have a deeper depth, meanwhile, the silicon oxide 202 at the side wall of the trench can also be retained due to the block of the side wall residue 304 of the nitrogenous compound, and the retained silicon oxide 202 gradually thickens downward from the bottom of the side wall residue 304 of the nitrogenous compound. Since the side wall residue 304 of the nitrogenous compound is used as the hard mask for etching, a photoetching plate is not necessary, thereby saving the cost. In order to obtain the silicon oxide 202 which gradually thickens downward, the dry-etching can be used in step S170. Specifically, the high density plasma etching can be used in the present embodiment.

Figure 5:
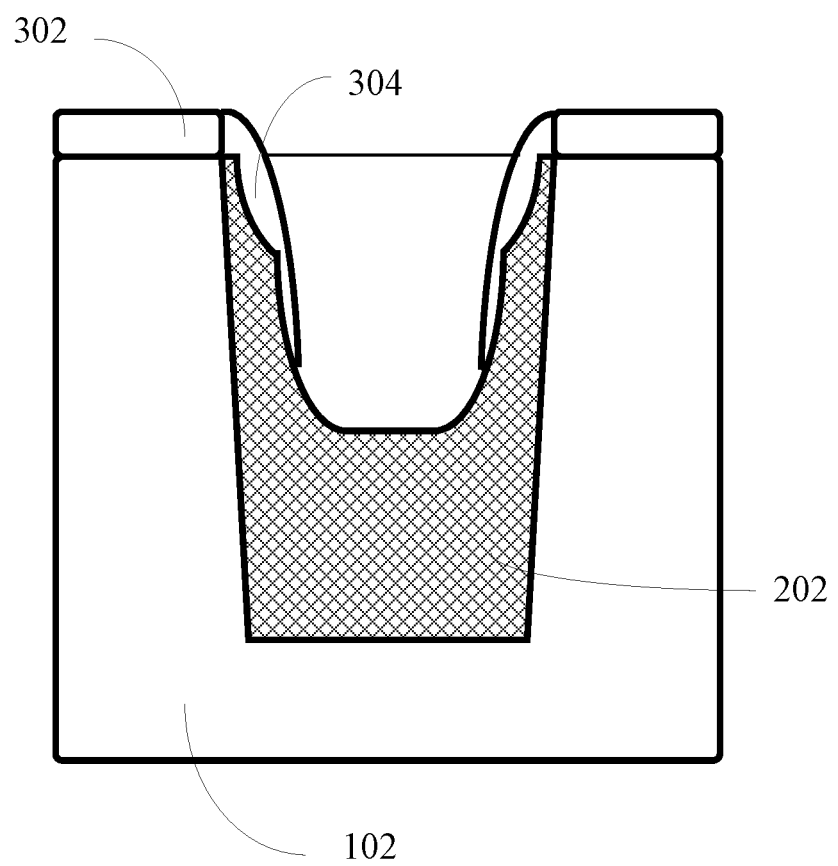

Referring to FIG. 5, if an over-etching occurs in step S170, the morphology of side wall silicon oxide 202 cannot be ensured, therefore, the aforementioned step S150 to step S170 need to be repeated until a required thickness of bottom silicon oxide is obtained. That is, the thickness of bottom silicon oxide can be easily adjusted in the present disclosure which can further increase a space for decreasing a feedback capacitance. The specific depth for each etching can be obtained by collecting data of tests. After etching and obtaining a required thickness of the bottom silicon oxide, the silicon oxide in the trench includes the bottom silicon oxide and the side wall silicon oxide, and the thickness of the side wall silicon oxide gradually thickens from the top of the trench to the bottom of the trench. It is should be understood that if the depth of the trench is small, step S150 to step S170 could be performed once.

In S210, the nitrogenous compound in the trench is removed.

In order to remove the nitrogenous compound completely, a wet etching can be used, for example, etching with concentrated phosphoric acid as etchant. In the present embodiment, both the silicon nitride layer 302 and the side wall residue 304 of nitrogenous compound are removed by the concentrated phosphoric acid.

In S220, the trench is filled with polysilicon as a shield gate.

Figure 6:
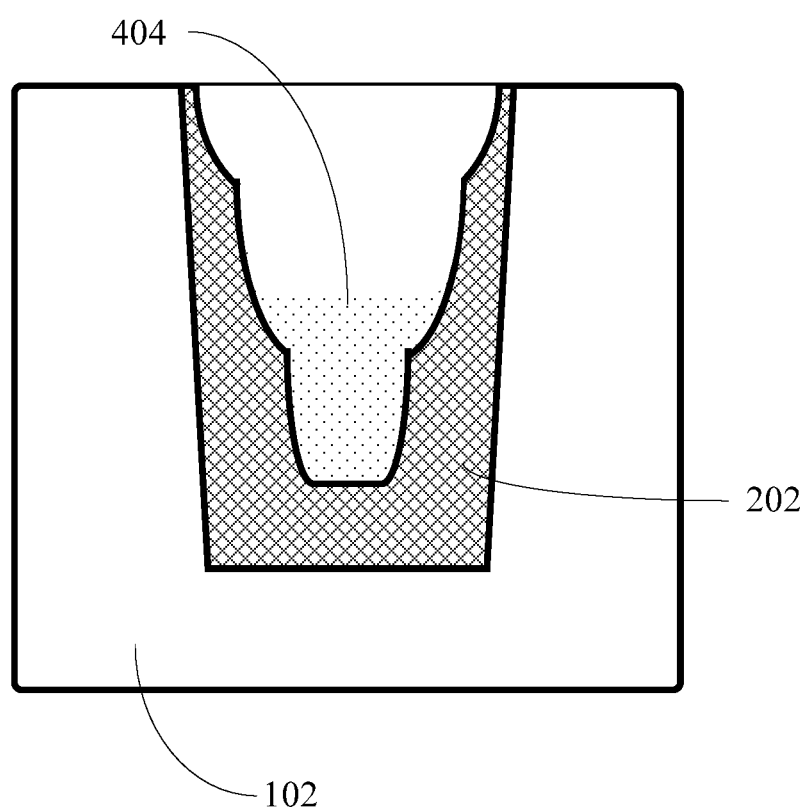

As shown in FIG. 6, the trench is filled with polysilicon according to a thickness required by the shield gate. In an embodiment, an excessive polysilicon can be deposited into the trench, and then CMP is performed and the polysilicon is etched to obtain the thickness required by the shield gate, thereby simplifying the process.

In S230, an insulation silicon oxide is formed on the shield gate.

Figure 7:
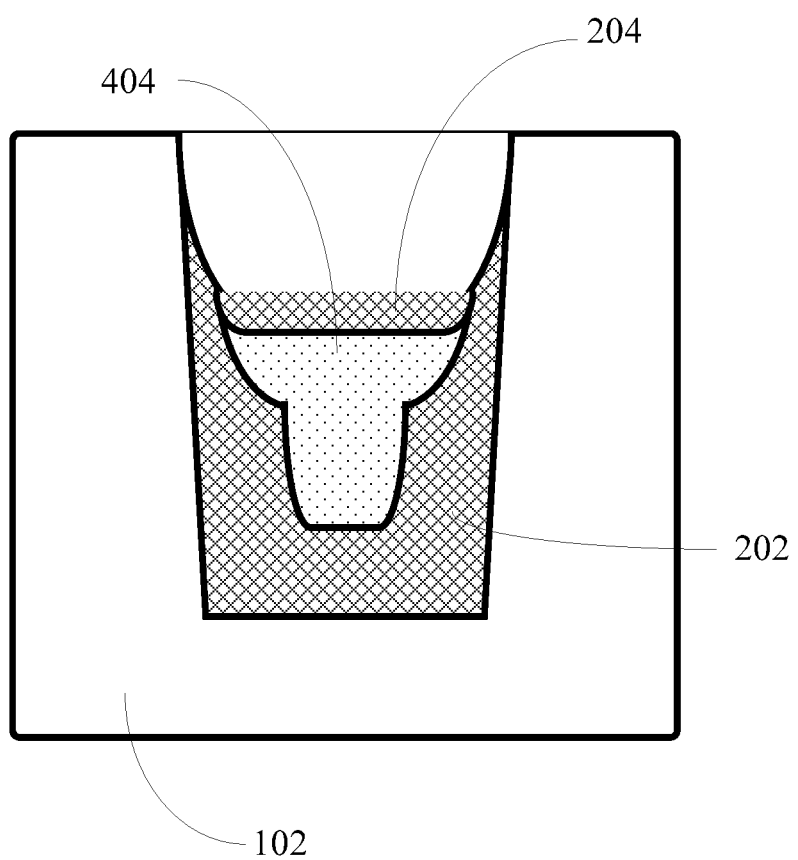

Referring to FIG. 7, the insulation silicon oxide 204 is formed. In an embodiment, the insulation silicon oxide 204 can be formed by using a process of growing high-temperature oxide film (HTO) or of a high density plasma chemical vapor deposition of silicon oxide, and the like.

In the present embodiment, the shield gate 404 can have a single segment structure, while in another embodiment, the shield gate 404 can have a multiple segments structure, that is, the shield gate has multiple layers, and adjacent two layers are separated from each other by one layer of the insulation silicon oxide. Specifically, the single segment structure or the multiple segments structure can be selected flexibly according to the trench depth which is determined by a withstand voltage of the device. The formed shield gate 404 is used as a stepped field plate along a drift region of the side wall of the trench, which is helpful to increase a carrier concentration of a channel multi-carrier-region 502 when working (the description for the channel multi-carrier-region 502 shall be referred to the embodiments hereinafter), and to reduce the on-resistance. In an embodiment, it is assumed that the shield gate 204 has a N segments structure, then step S220 and step S230 are performed successively with N times.

In S240, the insulation silicon oxide is filled with polysilicon as a control gate.

Figure 9:
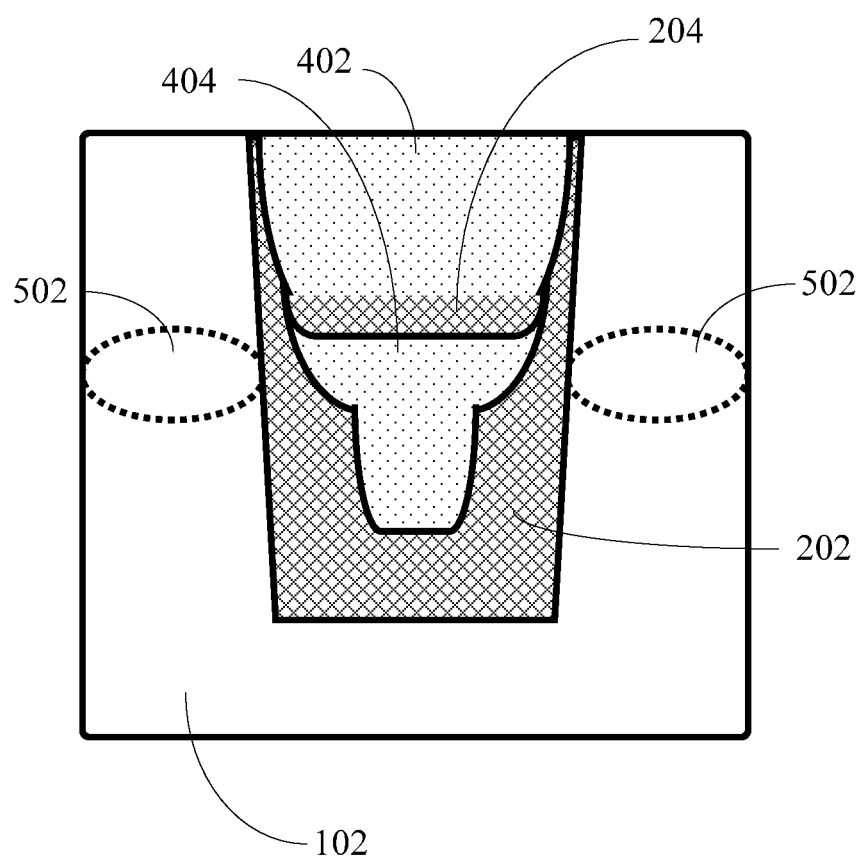

Referring to FIG. 9, the polysilicon is continuously filled into the trench on the insulation silicon oxide 204 to form the control gate 402. In an embodiment, the polysilicon filled in step S240 is in-situ polysilicon.

In an embodiment, the control gate 402 can be flattened by the chemical mechanical polishing after step S240 is finished.

Figure 8:
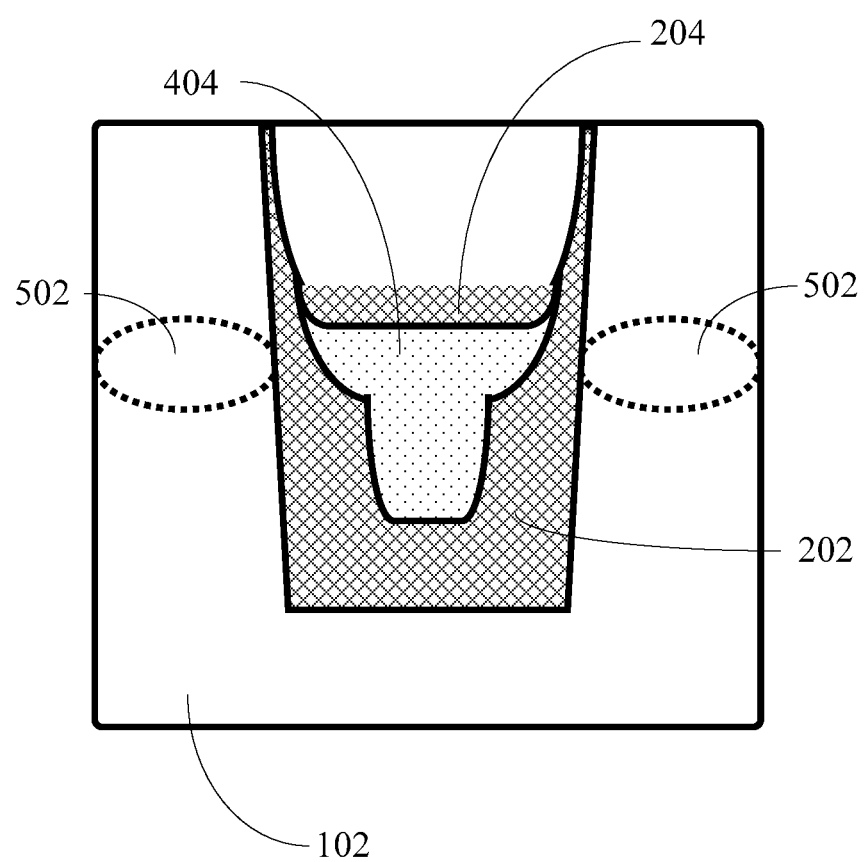

Referring to FIG. 8, in the present embodiment, a step of forming a vertical channel multi-carrier-region 502 at both sides of the trench by implanting ions between step S230 and step S240 is further included. In the present embodiment, the semiconductor device is of N-type, and the channel multi-carrier-region 502 is an N-type ring which is formed by implanting N-type ions. In another embodiment, a suitable implanting energy can be selected according to the depth of shield gate 404 (a distance between the shield gate and the silicon chip), the vertical channel multi-carrier-region combined by a plurality of N-type rings and P-type rings is formed by implanting successively N-type ions and P-type ions multiple times. The carrier concentration of the channel multi-carrier-region 502 when working is affected by the thicknesses of the control gate 402 and the insulation silicon oxide 204, it is helpful to form a side wall channel from the top of the trench side wall to the channel multi-carrier-region 502, and to reduce the on-resistance.

In S250, a well region adjacent to the trench is formed by implanting doped ions with a second conduction type.

Figure 10:
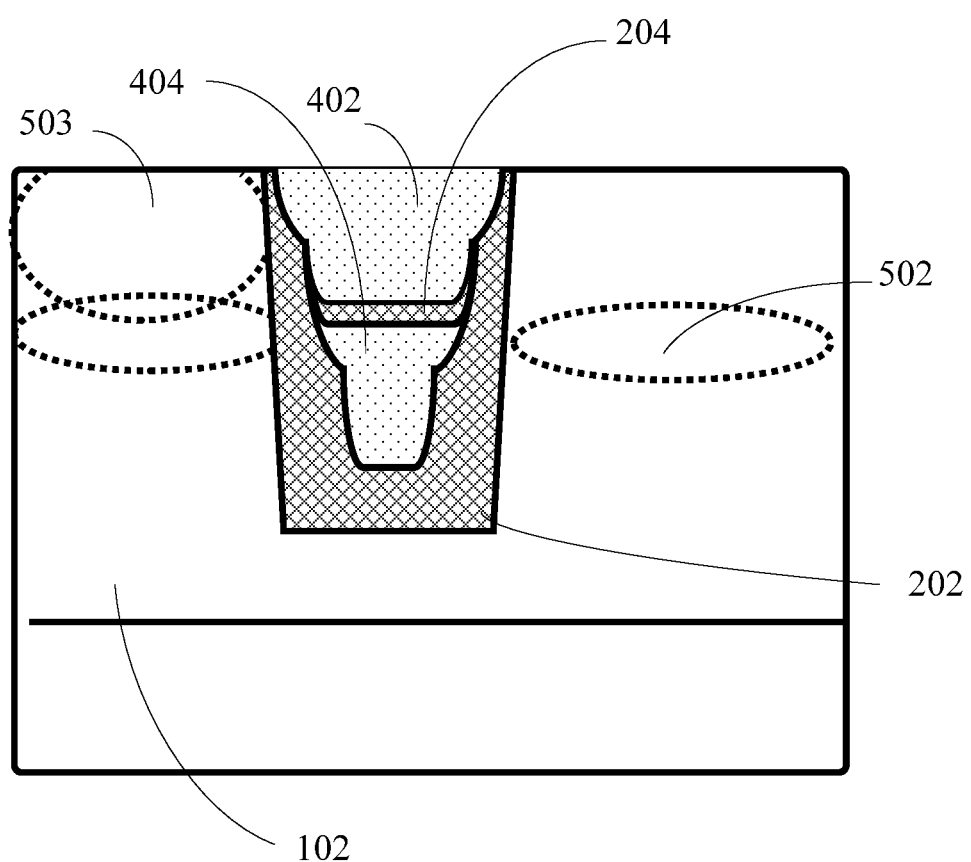

Referring to FIG. 10, in the present embodiment, the well region 502 is formed over the channel multi-carrier-region 502 at one side of the trench, and ions can be driven in the well after being implanted.

In S260, a plurality of polysilicon structures separated from each other are formed over the well region as a planar gate.

Figure 11:
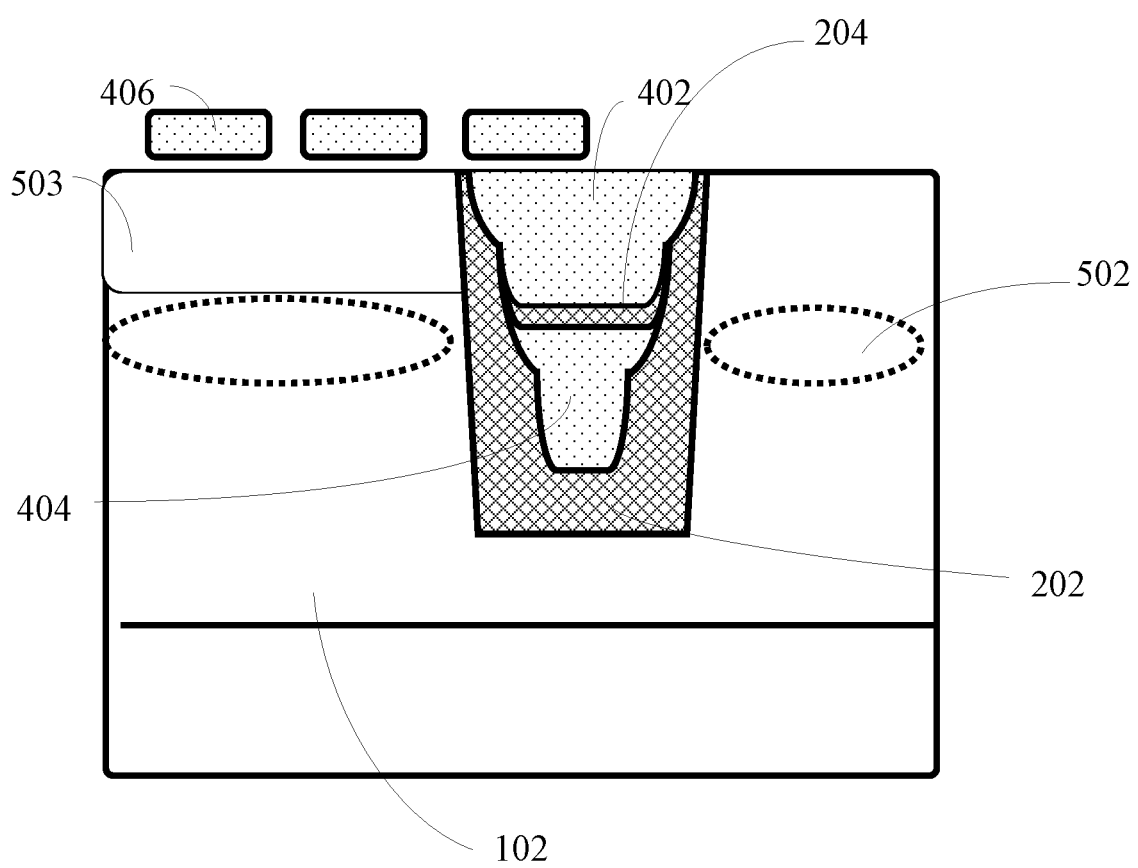

Referring to FIG. 11, a plurality of the polysilicon structures 406 are formed by photoetching and etching after depositing one layer of polysilicon on the surface of the silicon chip. In the present embodiment, a portion of the polysilicon structure 406 is formed on the well region 503, another portion of the polysilicon structure 406 is formed on the trench.

In S270, the control gate is electrically connected to the planar gate.

With respect to the aforementioned method for manufacturing the gate structure of the semiconductor device, since the side wall residue 304 of the nitrogenous compound is used as the hard mask for etching, a photoetching plate is not necessary, thereby saving the cost. Since the silicon oxide in the trench is formed by a process of depositing and etching, the oxidation time is reduced and the production efficiency is improved when compared with a process of thermal oxidation.

In an embodiment, it also includes a step of oxidizing the side wall of the trench prior to step S120. Oxidizing the side wall can be used to repair a defect on the silicon surface of the inner surface and bottom of the trench caused by the trench etching in step S110, for example, a defect caused by an impact of high energy particles due to the etching by the reaction ions, thereby eliminating a negative effect of the defect on gate oxygen. In an embodiment, the generated silicon oxide can also be peeled off after the side wall is oxidized.

Figure 12:
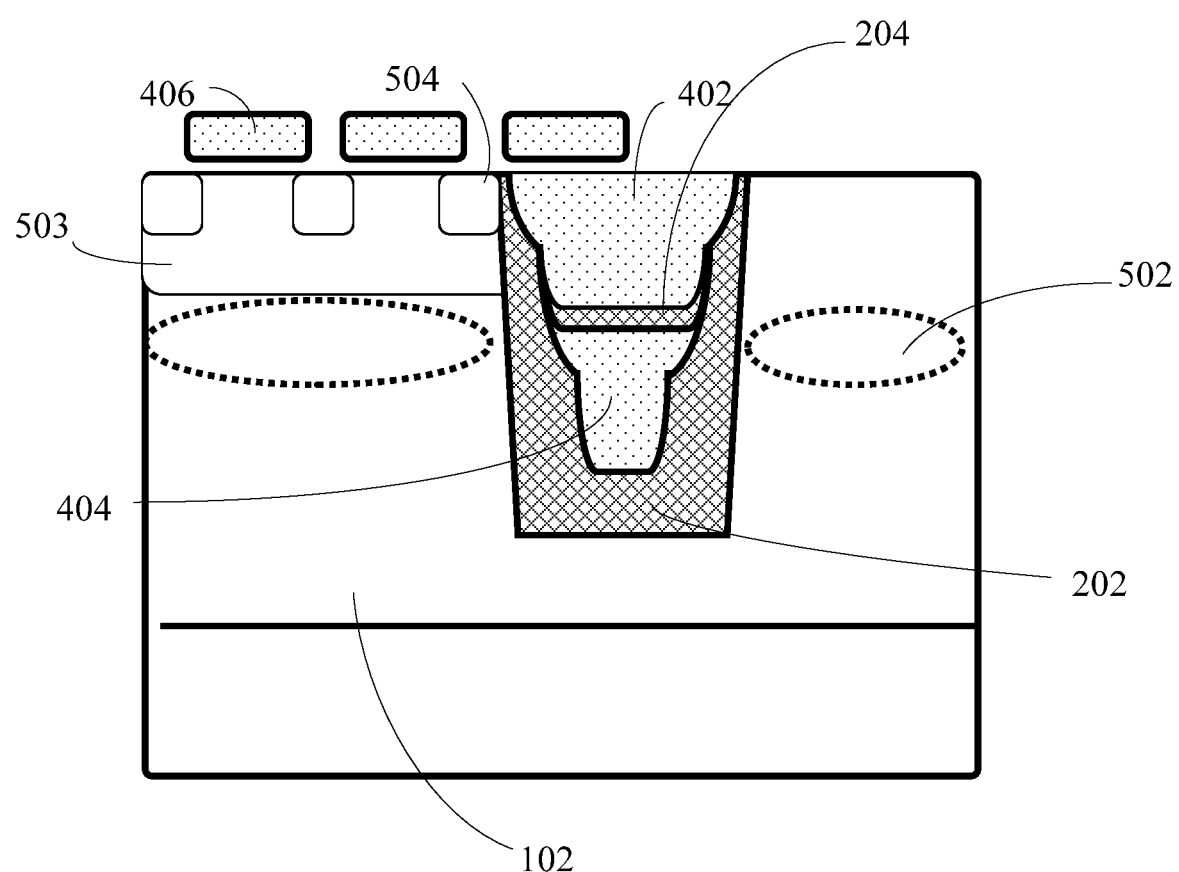
Figure 13:
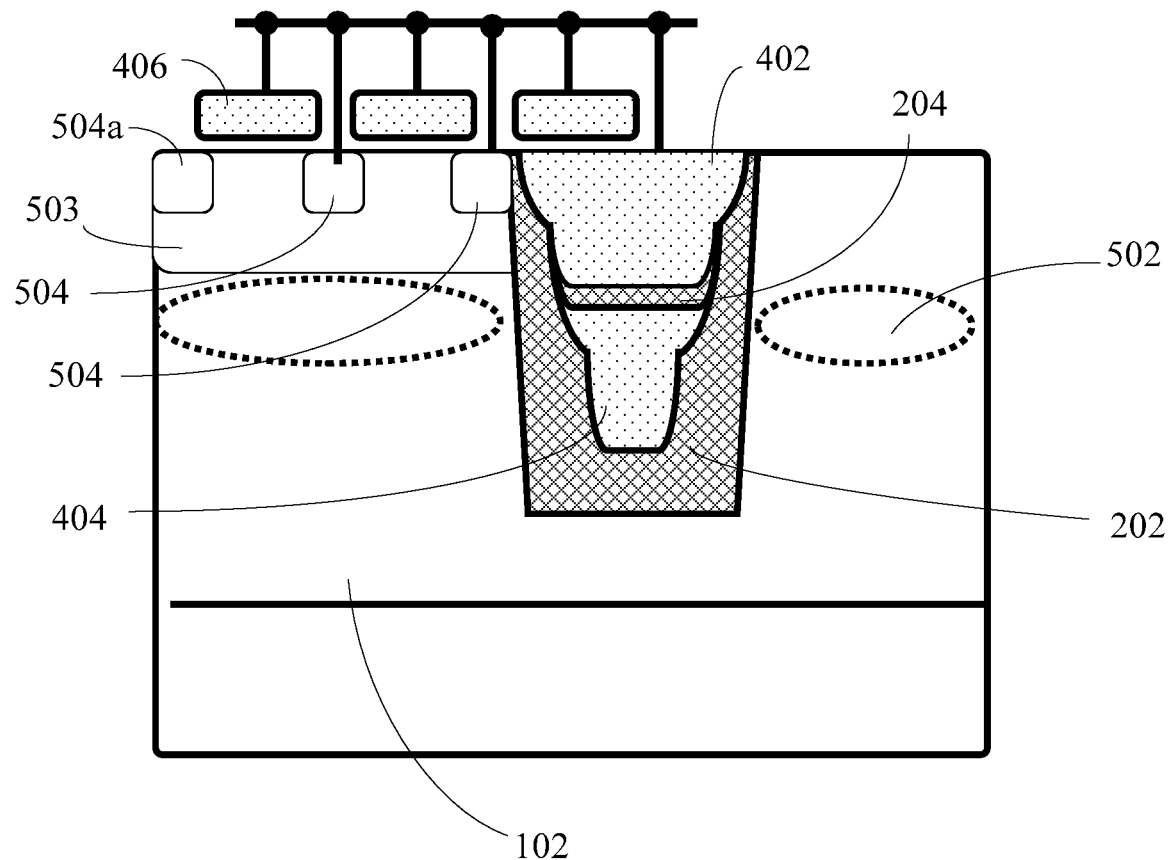
FIG. 13 is a schematic view of connecting potentials of a planar gate and a control gate with a potential of a first conduction type doped region together in an embodiment.

In an embodiment, after step S260, it also includes a step S262 of forming a plurality of first conduction type doped regions 504 separated from each other under adjacent polysilicon structure 406 and in the well region 503 by implanting ions. After step S262 is finished, a cross-sectional view of the device is as shown in FIG. 12. A photoresist for the photoetching in step S260 is still retained as a mask while implanting ions. As shown in FIG. 13, in step S270, it is necessary to connect the first conduction type doped region 504 to the planar gate. The first conduction type doped region 504 can increase the carrier mobility in the channel under the planar gate and reduce the on-resistance of a transverse channel when the device is turned on. In the present embodiment, one part of the first conduction type doped region 504 implanted in step S262 is served as a source, which is not connect to the planar gate but to a bulk or ground.

The present disclosure also provides a gate structure of a semiconductor device, which can be manufactured by the afore-described manufacturing method. Referring to FIG. 13, the gate structure includes a trench gate, a planar gate, a well region 503, a first conduction type doped region 504, and a source 504a.

Specifically, the planar gate includes a plurality of polysilicon structures 406 separated from each other. The well region 503 with a second conduction type is adjacent to the trench gate and is disposed under the planar gate. The first conduction type doped region 504 is disposed in the well region 503 and includes a plurality of regions separated from each other. Each region is disposed under two adjacent polysilicon structures 406, and respective regions are electrically connected to the planar gate. In the present embodiment, the semiconductor device is an N-type device, and the first conduction type is N-type and the second conduction type is P-type.

The trench gate includes a silicon oxide filler 202, a control gate 402, a shield gate 404, and an insulation silicon oxide 204. Specifically, the silicon oxide filler 202 includes a side wall silicon oxide located at a trench side wall of the trench gate, and a bottom silicon oxide located at a bottom of the trench gate, and a thickness of the side wall silicon oxide gradually thickens along a downward direction. The control gate 402 of a polysilicon material is located over the shield gate and a side wall thereof is enclosed by the side wall silicon oxide. The control gate 402 is electrically connected to the planar gate. The shield gate 404 of a polysilicon material has a single segment structure in the embodiment shown in FIG. 13. In another embodiment, the shield gate 404 can also has a longitudinally arranged multiple segments structure, and adjacent shield gates 404 are separated from each other by the insulation silicon oxide 204. Whether the shield gate 404 has the single segment structure or the multiple segments structure specifically can be flexibly selected according to the depth of the trench. The insulation silicon oxide 204 is filled between adjacent control gate 402 and shield gate 404 in vertical direction. For the shield gate 404 having the multiple segments structure, the insulation silicon oxide 204 is also filled between adjacent shield gates 404.

The afore-described gate structure of the semiconductor device has a structure of the planar gate and a vertical trench gate, and the trench gate includes the control gate and the shield gate in vertical direction. Since a split first conduction type doped region 504 is used, the carrier mobility in the channel under the planar gate can be increased and an on-resistance of a transverse channel can be reduced when the device is turned on.

In the present embodiment, the gate structure also includes a channel multi-carrier-region 502 disposed at two sides of the trench gate, and the well region 503 is located over the channel multi-carrier-region 502 at one side of the trench gate. In an embodiment, the channel multi-carrier-region 502 is an N-type ring. The channel multi-carrier-region 502 is formed by implanting N-type ions after forming the shield gate 404 and the insulation silicon oxide 204. In another embodiment, a suitable implanting energy can be selected according to the depth of shield gate 404 (a distance between the shield gate and the silicon chip), the vertical channel multi-carrier-region combined by a plurality of N-type rings and P-type rings is formed by implanting successively N-type ions and P-type ions multiple times. The carrier concentration of the channel multi-carrier-region 502 when working is affected by the thicknesses of the control gate 402 and the insulation silicon oxide 204, it is helpful to form a side wall channel from the top of the trench side wall to the channel multi-carrier-region 502, and to reduce the on-resistance.

The shield gate 404 is used as a stepped field plate along the drift region of the side wall of the trench, which is helpful to increase a carrier concentration of the channel multi-carrier-region 502 when working.

The afore-described gate structure of semiconductor device is not only especially suitable for a LDMOS device, but also suitable for other semiconductor device using the trench gate structure.

The forgoing embodiments are merely illustrative of several embodiments of the present disclosure, and the description thereof is more specific and detailed, but is not to be construed as limiting the scope of the present disclosure. It should be noted that several variations and modifications may be made by those persons skilled in the art without departing from the spirit, which all fall into the protection scope of the present disclosure. Therefore, the scope of protection of the present disclosure should be subject to the appended claims.

What is claimed is:

1. A method for manufacturing a gate structure of a semiconductor device, comprising:
   a step A: forming a trench on a wafer surface;
   a step B: filling the trench with silicon oxide by deposition;
   a step C: removing a portion of the silicon oxide in the trench by etching;
   a step D: forming a silicon oxide corner structure at a top corner of the trench by thermal oxidizing, wherein the silicon oxide corner structure is a structure that the silicon oxide in the trench gradually thickens downward from the corner;
   a step E: depositing a nitrogenous compound at the wafer surface, covering a surface of the silicon oxide and a surface of the silicon oxide corner structure;
   a step F: dry-etching the nitrogenous compound to remove the nitrogenous compound at the surface of the silicon oxide in the trench and forming a side wall residue of the nitrogenous compound extending into the trench on the surface of the silicon oxide corner structure;
   a step G: removing a portion of the silicon oxide in the trench by etching with the side wall residue of the nitrogenous compound as a mask;
   a step H: removing the nitrogenous compound in the trench;
   a step I: filling the trench with polysilicon as a shield gate;
   a step J: forming an insulation silicon oxide on the shield gate;
   a step K: filling with polysilicon on the insulation silicon oxide as a control gate;
   a step L: forming a well region adjacent to the trench by implanting doped ions with a second conduction type;
   a step M: forming a plurality of polysilicon structures separated from each other over the well region as a planar gate;
   a step N: electrically connecting the control gate to the planar gate.

2. The method of claim 1, wherein the shield gate has a longitudinally arranged multiple segments structure, and adjacent shield gates are separated from each other by the insulation silicon oxide.

3. The method of claim 1, wherein after the step M, the method further comprises a step of forming a plurality of doped regions with a first conduction type separated from each other under adjacent polysilicon structures and in the well region by implanting ions, and a step of connecting respective doped regions with the first conduction type to the planar gate; the first conduction type and the second conduction type are opposite conduction types.

4. The method of claim 1, wherein prior to the step L, the method further comprises a step of forming a vertical channel multi-carrier-region at both sides of the trench by implanting ions, wherein the well region is formed over the vertical channel multi-carrier-region at one side, and ions with a first conduction type are implanted in the step L.

5. The method of claim 1, wherein prior to the step L, the method further comprises a step of forming a vertical channel multi-carrier-region at both sides of the trench by implanting ions, wherein the well region is formed over the vertical channel multi-carrier-region at one side, and the step L comprises implanting ions with a first conduction type and ions with the second conduction type.

6. The method of claim 1, wherein prior to the step B, the method further comprises a step of oxidizing a side wall of the trench.

7. The method of claim 1, wherein in the step A, the trench is formed by etching with silicon nitride as a mask.

8. The method of claim 1, wherein between the step B and step C, the method further comprises a step of removing silicon oxide exposed outside the trench by a chemical mechanical polishing.

9. The method of claim 7, wherein between the step B and step C, the method further comprises a step of polishing the silicon oxide exposed outside the trench until being aligned with the silicon nitride.

10. The method of claim 1, wherein the method further comprises a step of epitaxially growing an epitaxial layer on a substrate by a epitaxial process, wherein a doping concentration of the epitaxial layer is greater than that of the substrate; and in the step of forming the trench on the wafer surface, a first trench is formed in the epitaxial layer.

11. The method of claim 1, wherein in the step H, the nitrogenous compound is removed with a concentrated phosphoric acid as an etchant.

12. The method of claim 1, wherein in the step B, the silicon oxide is deposited by using a high-density plasma chemical vapor deposition process.

13. The method of claim 1, wherein after the step K, the method further comprises a step of flattening the control gate via a chemical mechanical polishing.

14. The method of claim 1, wherein a portion of the polysilicon structures formed by the step M is formed on the well region, and another portion of the polysilicon structures formed by the step M is formed on the trench.

15. The method of claim 1, wherein a temperature of the thermal oxidizing in the step D ranges from 800° C. to 950° C.

16. The method of claim 1, further comprising:
successively and repeatedly performing the step E to step G, until the silicon oxide in the trench is etched to reach a required thickness of a bottom silicon oxide, wherein as the step F is performed each time, the side wall residue of the nitrogenous compound further extends into the trench, wherein the silicon oxide in the trench comprises the bottom silicon oxide and a side wall silicon oxide, and a thickness of the side wall silicon oxide gradually thickens from a top of the trench to a bottom of the trench.

17. A gate structure of a semiconductor device, comprising:
a trench gate;
a planar gate comprising a plurality of polysilicon structures separated from each other;
a well region of a second conduction type, being adjacent to the trench gate and being disposed under the planar gate;
a first conduction type doped region being disposed in the well region and comprising a plurality of regions separated from each other, wherein each region is disposed under adjacent polysilicon structures, and respective regions are electrically connected to the planar gate; and the first conduction type and the second conduction type are opposite conduction types; and
a source of the first conduction type being disposed in the well region;
wherein the trench gate comprises:
a silicon oxide filler comprising a side wall silicon oxide located at a trench side wall of the trench gate, and a bottom silicon oxide located at a bottom of the trench gate, wherein a thickness of the side wall silicon oxide gradually thickens along a downward direction;
a shield gate of a polysilicon material having a single segment structure;
a control gate of a polysilicon material being located over the shield gate, wherein a side wall of the control gate is enclosed by the side wall silicon oxide, and the control gate is electrically connected to the planar gate; and
an insulation silicon oxide being filled between adjacent control gate and shield gate in vertical direction.

18. The gate structure of the semiconductor device of claim 17, wherein the first conduction type is N-type, and the second conduction type is P-type.

19. A gate structure of a semiconductor device, comprising:
a trench gate;
a planar gate comprising a plurality of polysilicon structures separated from each other;
a well region of a second conduction type being adjacent to the trench gate and being disposed under the planar gate;
a first conduction type doped region being disposed in the well region and comprising a plurality of regions separated from each other, wherein each region is disposed under adjacent polysilicon structures, and respective regions are electrically connected to the planar gate; and the first conduction type and the second conduction type are opposite conduction types; and
a source of the first conduction type being disposed in the well region;
wherein the trench gate comprises:
a silicon oxide filler comprising a side wall silicon oxide located at a trench side wall of the trench gate, and a bottom silicon oxide located at a bottom of the trench gate, wherein a thickness of the side wall silicon oxide gradually thickens along a downward direction;
a shield gate of a polysilicon material having a longitudinally arranged multiple segments structure;
a control gate of a polysilicon material and being located over the shield gate, wherein a side wall of the control gate is enclosed by the side wall silicon oxide, and the control gate is electrically connected to the planar gate; and
an insulation silicon oxide being filled between adjacent control gate and shield gate in vertical direction and between adjacent shield gates of the multiple segments structure.

20. The gate structure of the semiconductor device of claim 19, wherein the first conduction type is N-type, and the second conduction type is P-type.

* * * * *